(12) United States Patent
Kataoka et al.

(10) Patent No.: US 9,508,533 B2
(45) Date of Patent: Nov. 29, 2016

(54) THERMIONIC CONVERTER AND MANUFACTURING METHOD OF ELECTRODE OF THERMIONIC CONVERTER

(71) Applicant: DENSO CORPORATION, Kariya, Aichi-pref. (JP)

(72) Inventors: Mitsuhiro Kataoka, Kasugai (JP); Yuji Kimura, Nagoya (JP); Susumu Sobue, Obu (JP)

(73) Assignee: DENSO CORPORATION, Kariya (JP)

( * ) Notice: Subject to any disclaimer, the term of this patent is extended or adjusted under 35 U.S.C. 154(b) by 160 days.

(21) Appl. No.: 14/091,636

(22) Filed: Nov. 27, 2013

(65) Prior Publication Data

US 2014/0158179 A1    Jun. 12, 2014

(30) Foreign Application Priority Data

Dec. 11, 2012    (JP) ................................ 2012-270512

(51) Int. Cl.
| | | |
|---|---|---|
| *H01L 35/32* | (2006.01) | |
| *H01L 35/34* | (2006.01) | |
| *H01J 45/00* | (2006.01) | |
| *C23C 16/56* | (2006.01) | |
| *C23C 16/27* | (2006.01) | |
| *C23C 16/32* | (2006.01) | |
| *C23C 16/50* | (2006.01) | |

(52) U.S. Cl.
CPC ............. *H01J 45/00* (2013.01); *C23C 16/27* (2013.01); *C23C 16/32* (2013.01); *C23C 16/50* (2013.01); *C23C 16/56* (2013.01); *H01L 35/32* (2013.01); *H01L 35/34* (2013.01)

(58) Field of Classification Search
CPC ....... C23C 16/50; C23C 16/27; C23C 16/32; C23C 16/56; H01L 35/32; H01L 35/34; H01J 45/00
USPC ................. 136/205; 427/335, 249.9, 249.17, 427/255.15, 255.28
See application file for complete search history.

(56) References Cited

U.S. PATENT DOCUMENTS

| | | | |
|---|---|---|---|
| 2009/0141376 A1* | 6/2009 | Smith ................. | G01N 21/553 359/833 |
| 2009/0191013 A1* | 7/2009 | Qi ............................ | B23C 3/00 408/18 |
| 2011/0017253 A1 | 1/2011 | Kataoka et al. | |
| 2011/0139205 A1 | 6/2011 | Kimura et al. | |
| 2011/0221328 A1* | 9/2011 | Nemanich ................ | H01J 1/14 313/355 |

FOREIGN PATENT DOCUMENTS

| | | |
|---|---|---|
| JP | H06-275554 A | 9/1994 |
| JP | 2004-349398 A | 12/2004 |
| JP | 2007-258342 A | 10/2007 |

OTHER PUBLICATIONS

Zhu, W., Stoner, B.R., Williams, B.E., Glass, J.T.,"Growth and Characterization of Diamond Films on Nondiamond Substrates for Electronic Applications", 1991, IEEE, p. 621-646.*
F.A.M. Koeck, Y.J. Tang, R.J. Nemanich, Organizing Committee NDNC2007, NDNC 2007 New Diamond and Nano Carbons 2007, May 28, 2007 p. 97 "Direct thermionic energy conversion from nitrogen doped diamond films".
Office Action issued Dec. 8, 2015 in the corresponding JP application No. 2012-270512 (with English translation).

* cited by examiner

*Primary Examiner* — Katherine A Bareford
*Assistant Examiner* — Christina McClure
(74) *Attorney, Agent, or Firm* — Posz Law Group, PLC

(57) ABSTRACT

In a method of manufacturing an electrode of a thermionic converter, a carbide layer is formed on a base material by a vapor synthesis, an N-type diamond layer doped with a donor impurity is formed on the carbide layer by a vapor synthesis, and a surface of the N-type diamond layer is terminated with hydrogen. The base material is made of a metal, and the carbide layer is made of a metal carbide.

7 Claims, 3 Drawing Sheets

13, 19

15, 21
13, 19

17, 23
15, 21
13, 19

5, 7
17, 23
15, 21
13, 19

THERMIONIC CONVERTER AND MANUFACTURING METHOD OF ELECTRODE OF THERMIONIC CONVERTER

CROSS REFERENCE TO RELATED APPLICATION

This application is based on Japanese Patent Application No. 2012-270512 filed on Dec. 11, 2012, the disclosure of which is incorporated herein by reference.

TECHNICAL FIELD

The present disclosure relates to a thermionic converter that converts thermal energy into electric energy, and a method of manufacturing an electrode of the thermionic converter.

BACKGROUND

A thermionic converter converts thermal energy into electric energy utilizing a phenomenon in which thermions are emitted from a surface of an electrode at a high temperature.

According to a non-patent document 1, when a diamond (diamond semiconductor) is used for an emitter (emitter electrode) and a collector (collector electrode) of a thermionic converter, a work function reduces and thermions are efficiently emitted from a surface of the electrode due to an effect of negative electron affinity (NEA).

In order to inject or extract electrons into or from the diamond at a high efficiency, it is necessary to form an ohmic contact. To form the ohmic contact in the electrode using the diamond, generally, a metal is vapor-deposited in diamond and then annealing is performed at a high temperature. Thus, a reaction layer is formed at an interface between the metal and the diamond.

[Non-Patent Document 1]
F. A. M. Koeck, Y. j. Tang, R, j. Nemanich, Organizing Committee NDNC2007, NDNC 2007 New Diamond and Nano Carbons 2007, May 28, 2007, p 97, "Direct thermionic energy conversion from nitrogen doped diamond films", North Carolina State University, Raleigh, N.C., USA, Arizona State University, Tempe, Ariz., USA However, when the diamond is used as a material of an electrode, such as an emitter electrode, of the thermionic converter, the following drawbacks arise:

In order to improve the efficiency of thermions, a method of terminating the surface of the diamond layer of the emitter electrode with hydrogen atoms has been known. As an example of the hydrogen termination method, for example, a diamond layer is formed by a microwave chemical vapor deposition (CVD) technique, and then carbon atoms on the surface of the diamond layer are terminated by hydrogen separation through a hydrogen plasma treatment in the same chamber. As a result, the surface which has a negative electron affinity is formed.

However, when the metal is deposited on the hydrogen-terminated diamond layer and is annealed to form the reaction layer for the ohmic contact, the bonding between the carbon atom and the hydrogen atom on the surface of the diamond layer is likely to be broken and the hydrogen atom is likely to be separated. As a result, the work function increases and the negative electron affinity reduces. Further, the emission of the thermions from the surface deteriorates.

In regard to the collector electron, similarly, when the reaction layer is formed after the hydrogen termination in the similar manner, the hydrogen atoms are likely to be separated, resulting in an increase in work function.

Accordingly, in the emitter electrode and the collector electrode manufactured by the above described method, the power generation efficiency of the thermionic converter is likely to be reduced.

SUMMARY

It is an object of the present disclosure to provide a thermionic converter with high power generation, and a method of manufacturing an electrode of the thermionic converter.

According to an aspect of the present disclosure, in a method of manufacturing an electrode of a thermionic converter, a carbide layer is formed on a base material by a vapor synthesis, an N-type diamond layer doped with a donor impurity is formed on the carbide layer by a vapor synthesis, and a surface of the N-type diamond layer is terminated with hydrogen. The base material is made of a metal, and the carbide layer is made of a metal carbide.

If a reaction layer for an ohmic contact is formed by a high-temperature annealing after a surface of an N-type diamond layer provided with a metal layer is terminated with hydrogen, as in a conventional manner, the hydrogen is likely to be separated from the surface of the N-type diamond layer. In the method described above, on the other hand, the carbide layer for the ohmic contact is formed on the surface of the base material, and then the N-type diamond layer is formed on the carbide layer, Thereafter, the surface of the N-type diamond layer is terminated with the hydrogen. Accordingly, the separation of the hydrogen from the surface of the N-type diamond layer can be reduced.

In addition, the carbide layer forms a high-density defective level and contributes to electronic hopping conduction. Therefore, an ohmic contact with a low resistance can be realized. In a case where the electrode is an emitter electrode, since the separation of hydrogen is reduced, the work function reduces, and the negative electron affinity increases. As a result, the emission efficiency of the thermions from the surface improves. In a case where the electrode is a collector electrode, since the separation of hydrogen from the hydrogen-terminated surface is reduced. Therefore, the work function reduces, resulting in an increase in power output.

Accordingly, when the emitter electrode or the collector electrode is manufactured by the above-described method, the power generation efficiency of the thermionic converter improves. Also, the manufacturing method described above is simple, as compared with a conventional method employing the high temperature annealing.

According to an aspect of the present disclosure, a thermionic converter includes an emitter electrode and a collector electrode. The emitter electrode receives heat from a heat source and emits thermions. The collector electrode is opposed to the emitter electrode and captures the thermions emitted from the emitter electrode, thereby to covert thermal energy into electric energy. At least one of the emitter electrode and the collector electrode includes a base material, a carbide layer and an N-type diamond layer. The base material is made of a metal. The carbide layer is disposed on the base material. The N-type diamond layer is disposed on the carbide layer, and has a surface terminated with hydrogen.

In the case of the emitter electrode, since the work function is low, the negative electron affinity improves, and the emission efficiency of the thermions from the surface of the emitter electrode improves. In the case of the collector electrode, the work function is low. Accordingly, the power generation efficiency of the thermionic converter improves.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Figure 1:
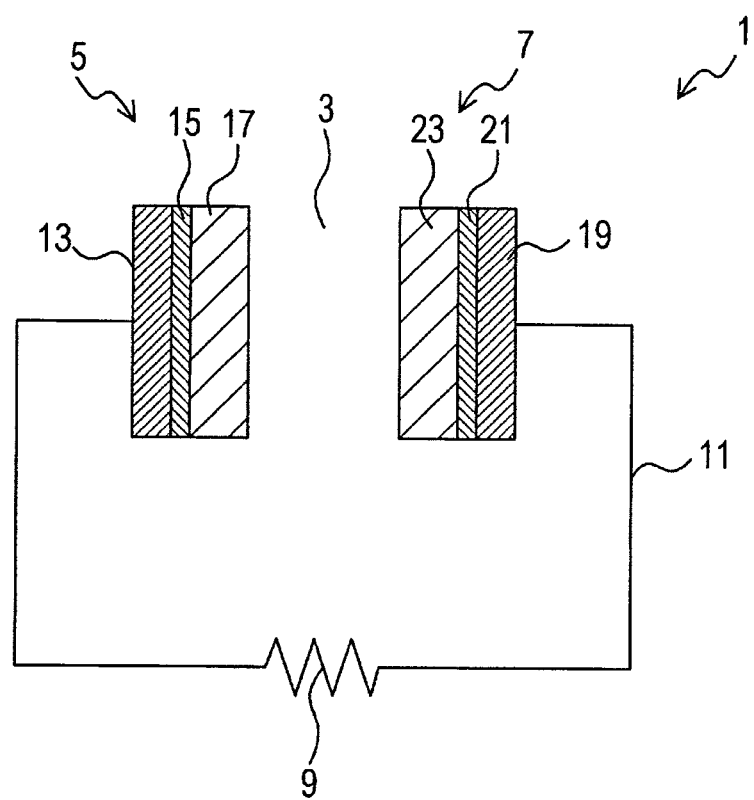
FIG. 1 is a schematic diagram illustrating a thermionic converter according to an example 1 of the present disclosure.

An embodiment of the present disclosure will be described hereinafter.

A thermionic converter includes an emitter electrode and a collector electrode. The emitter electrode receives heat from a heat source. The collector electrode is opposed to the emitter electrode and captures thermions emitted from the emitter electrode. The thermionic converter converts thermal energy into electric energy. At least one of the emitter electrode and the collector electrode includes a base material, a carbide layer and an N-type diamond layer. The base material is made of a metal. The carbide layer is disposed on the base material. The N-type diamond layer is disposed on the carbide layer. The N-type diamond layer has a surface terminated with hydrogen.

At least one of an emitter electrode and a collector electrode of a thermionic converter is manufactured as follows: a carbide layer made of a metal carbide is formed on a base material made of a metal by a vapor synthesis; an N-type diamond layer doped with a donor impurity is formed on the carbide layer by a vapor synthesis; and a surface of the N-type diamond layer is terminated with hydrogen.

(1) As the base material of the emitter electrode or the collector electrode, a film or a base plate may be employed. A metal of the base material may be a simple metal or a metal alloy.

As the vapor synthesis technique, a microwave plasma chemical vapor deposition (CVD) method or any other method may be employed. For example, a CVD method, such as RF plasma CVD or DC plasma CVD, and pattering, such as RF plasma spattering, or DC plasma spattering, may be employed.

(2) The metal of the base material may be one of titanium (Ti), zirconium (Zr), hafnium (Hf), molybdenum (Mo), iridium (Ir), tantalum (Ta), tungsten (W), chromium (Cr), and platinum (Pt). Alternatively, the metal of the base material may be an alloy made of at least two of Ti, Zr, Hf, Mo, ir, Ta, W, Cr, and Pt. Therefore, a carbide layer is made of a carbide of the metal(s) described above. For example the carbide may be made of a titanium carbide or a molybdenum carbide.

These simple metals and metal alloys have a conductive property and a high reactivity with carbon. Further, these simple metals and metal alloys are not melted or softened even at a high temperature during the vapor synthesis, and have a high heat resistance. Therefore, these simple metals and metal alloys are preferable.

(3) The temperature of the base material at the time of forming the carbide layer may be 600 degrees Celsius (° C.) or more (e.g., 1200 degrees Celsius or less). In such a temperature condition, the carbide layer is suitably formed.

According to the examinations of the inventors, when the temperature of the bate material is lower than 600 degrees Celsius, such as 550 degrees Celsius or less, generation of the carbide layer is slow and such a temperature is not preferable.

(4) In a manufacturing method of a thermionic converter, a mixed gas of methane and hydrogen is supplied as a raw material and a carbide layer is formed on a base material by a microwave plasma CVD technique. Then, a mixed gas of methane, hydrogen and a donor impurity is supplied as a raw material, and an N-type diamond layer doped with the donor impurity is formed on the carbide layer by a microwave plasma CVD technique. Further, hydrogen is supplied and a surface of the N-type diamond layer is terminated with hydrogen in a hydrogen plasma by a microwave plasma CVD technique.

In such a manufacturing method, a highly efficient thermionic converter can be easily manufactured.

(5) A flow ratio of methane to hydrogen (methane/hydrogen) may be 0.01 or more (e.g., 0.2 or less). When the flow ratio is set in this manner, the carbide layer can be easily formed.

According to the examinations of the inventors, when the flow ratio is lower than 0.01 (e.g., 0.005 or less), the generation of the carbide layer is slow, and such a flow ratio is not always preferable.

(6) After the carbide layer is formed, the N-type diamond layer is formed. Thereafter, the temperature of the base material is lowered to 100 degrees Celsius or less in a hydrogen atmosphere. In this way, the surface of the N-type diamond layer may be terminated with hydrogen.

That is, when the temperature in the hydrogen termination is set equal to or less than 100 degrees Celsius, separation of the hydrogen is reduced, and the hydrogen termination can be properly performed.

(7) The donor impurity (dopant) may be nitrogen or phosphorous.

EXAMPLE 1

Hereinafter, the embodiment of the present disclosure will be described more in detail with reference to examples.

A thermionic converter and a method of manufacturing the thermionic converter of an example 1 will be described.

The thermionic converter of the example 1 converts thermal energy into electric energy utilizing thermions transferring between a pair of electrodes opposed to each other.

(a) Firstly, a structure of the thermionic converter will be described.

As shown in FIG. 1, a thermionic converter 1 includes an emitter electrode 5 and a collector electrode 7. Each of the emitter electrode 5 and the collector electrode 7 has substantially a flat plate shape. The emitter electrode 5 and the collector electrode 7 are disposed in a vacuum housing (not shown). The emitter electrode 5 and the collector electrode 7 are arranged parallel to each other and opposed to each other across a predetermined gap (air gap) 3. The emitter electrode 5 and the collector electrode 7 are electrically connected through a load 9, in a circuit 11.

The emitter electrode 5 includes an emitter base plate 13, a carbide layer 15 disposed on the emitter base plate 13, and an emitter layer 17 disposed on the carbide layer 15. The collector electrode 7 includes a collector base plate 19, a carbide layer 21 disposed on the collector base plate 19, and a collector layer 23 disposed on the carbide layer 21.

Figure 2A:
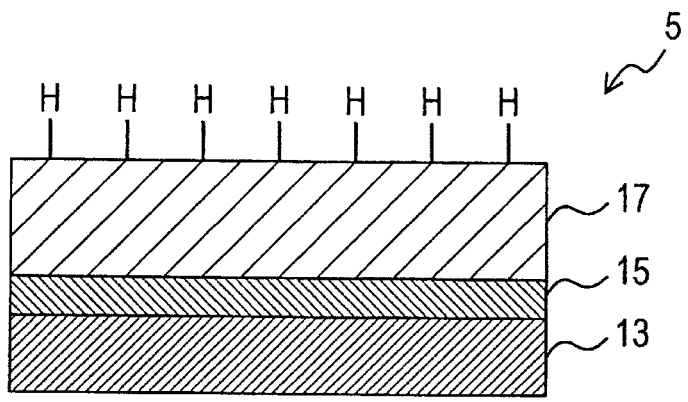
FIG. 2A is an enlarged cross-sectional view of an emitter electrode of the thermionic converter according to the example 1.
Figure 2B:
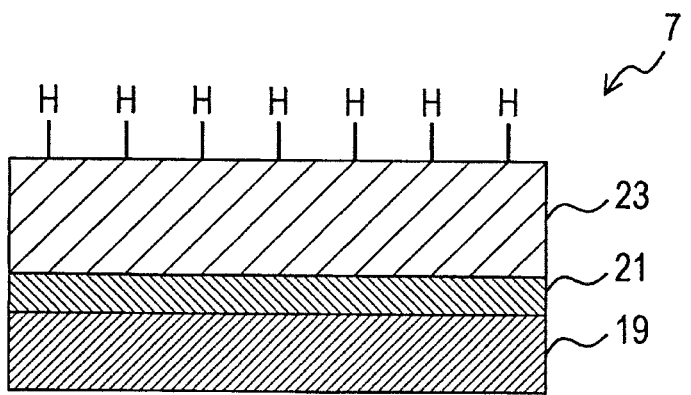
FIG. 2B is an enlarged cross-sectional view of a collector electrode of the thermionic converter according to the example 1.

As shown in FIG. 2A, the emitter base plate 13 serves as a base (base material) of the emitter electrode 5. The emitter base plate 13 is made of a metal or a metal alloy. For example, the emitter base plate 13 is made of titanium (Ti) or molybdenum (Mo). The emitter base plate 13 has a conductive property and a heat resistance property. The emitter base plate 13 needs to have a heat resistance property which can avoid deformation and melting in a manufacturing process, which will be described later. The base of the emitter electrode 5 may be provided by a metal film or an allow film, in place of the metal base plate.

For example, a Ti base plate having a size of 1-inch squares may be employed as the metal base plate. In the example 1, the Ti base plate is exemplarily used.

The carbide layer 15 is formed on the surface of the emitter base plate 13. The carbide layer 15 is formed by carbonizing the metal (i.e., Ti) of the emitter base plate 13. In this case, the carbide of Ti, that is, the titanium carbide layer is formed as the carbide layer 15.

The carbide layer 15 is mainly formed as carbon enters the surface of the emitter base plate 13 and is reacted. That is, the carbide layer 15 is formed by carburizing the surface of the emitter base plate 13.

Further, the emitter layer 17 is formed on the surface of the carbide layer 15. The emitter layer 17 is an N-type diamond layer (diamond semiconductor film) as an N-type semiconductor.

For example, nitrogen (N) is used in the N-type diamond layer, as a donor impurity (dopant). When the nitrogen is used as the dopant, the work function of approximately 1.7 eV is obtained, As the donor impurity, any other dopant, such as phosphorous (P) may be used. In the example 1, nitrogen is exemplarily used as the dopant.

The concentration of the donor impurity of the N-type diamond layer is, for example, in a range from $10^{20}$ to $10^{21}$ (atoms $cm^{-3}$). For example, the concentration of the donor impurity of the N-type diamond layer is $10^{21}$ (atoms $cm^{-3}$).

In the example 1, at the surface of the emitter layer 17, hydrogen is bonded to carbon of the surface of the N-type diamond layer 17. That is, the surface of the emitter layer 17 is hydrogen-terminated.

The emitter layer 17 may contain a material, such as graphite, amorphous carbon, or mixture of graphite and amorphous carbon, other than the diamond.

Similar to the emitter electrode 5, the collector electrode 7 includes the collector base plate 19, the carbide layer 21 disposed on the collector base plate 19, and the collector layer 23 disposed on the carbide layer 21. The collector base plate 19 is, for example, made of Ti. The carbide layer 21 is, for example, made of a Ti carbide. The collector layer 23 is, for example, made of an N-type diamond layer to which nitrogen is doped as a dopant. The surface of the collector layer 23 is hydrogen-terminated.

The collector electrode 7 may have any structure, other than the above-described structure. For example, the collector electrode 7 may have a structure as disclosed in JP-A-2011-29427, which corresponds to US 2011/0017253 A1, or JP-A-2011-124412, which corresponds to US 2011/139205 A1.

For example, the collector electrode 7 may be provided by forming a collector layer 23 made of an N-type diamond layer (diamond semiconductor film) on a collector base plate 19 made of Mo or diamond.

As the donor impurity doped to the collector layer 23, for example, nitrogen is used. Further, any other dopant, such as phosphorous, may be used. The N-type diamond layer of the emitter electrode 5 and the N-type diamond layer of the collector layer 7 may be doped with different donor impurities.

When power generation is performed using the thermionic converter 1 with the structure described above, the emitter electrode 5 is kept at a high temperature such as 600 degrees Celsius, and the collector electrode 7 is kept at a temperature lower than the temperature of the emitter electrode 5 by 300 degrees Celsius. For example, the emitter electrode 5 is kept at a low temperature of 300 degrees Celsius.

When the emitter electrode 5 and the collector electrode 7 are applied with these temperatures, thermionic emitted from the emitter electrode 5 are captured by the collector electrode 7. As such, electric power is generated.

b) Next, a manufacturing method of the thermionic converter 1 of the example 1 will be described.

<Manufacturing Method of Emitter Electrode 5>

Figure 3A:
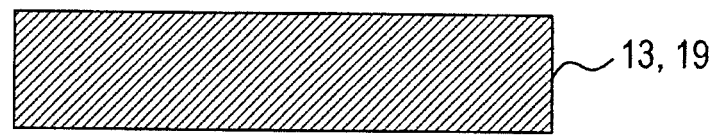
FIGS. 3A to 3D are cross-sectional views for illustrating a process of manufacturing the emitter electrode or the collector electrode of the thermionic converter according to the example 1.

As shown in FIG. 3A, the emitter base plate 13 made of a metal having a high reactivity with carbon is prepared. In the example 1, for example, the emitter base plate 13 made of Ti is used.

Figure 3B:
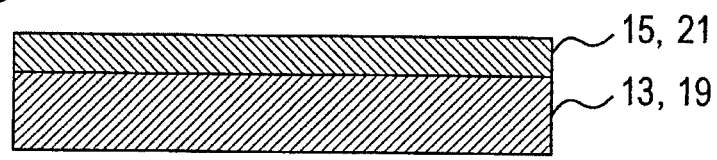

As shown in FIG. 3B, the carbide layer 15 is formed on the emitter base plate 13 by supplying a mixed gas of $CH_4$ and $H_2$, as a raw material (source gas), such as by a microwave plasma CVD method. (First step)

For example, the emitter base plate 13 is placed in a CVD device (not shown). The CVD device is held so that the temperature of the base plate is equal to or higher than 600 degrees Celsius, in particular, in a range from 600 degrees Celsius to 1200 degrees Celsius, and inside pressure is approximately 50 Torr, and the material (the mixed gas described above) for forming the carbide layer 15 is supplied to the CVD device. For example, the temperature of the base plate is 800 degrees Celsius.

As the source gas for forming the carbide layer 15, for example, a mixed gas in which $CH_4$ is diluted with $H_2$ is used. For example, a mixed gas having a flow ratio of $CH_4$ to $H_2$ ($CH_4/H_2$) being 0.01 or more, in particular, in a range from 0.01 to 0.2 is used. For example, a mixed gas having the flow ratio of $CH_4/H_2$ being 0.01 is used.

In this way, the carbide layer 15 is formed on the emitter base plate 13. The carbide layer 15 is formed due to the carbon entering the surface of the emitter base plate 13. In other words, a part of the surface layer of the emitter base plate 13 becomes the carbide layer 15.

That is, the metal of the emitter base plate 13 is Ti, which has a high reactivity with the carbon. Therefore, carburizing of the surface of the metal is progressed, and the carbide layer 15, which is the interface of the metal and the N-type diamond layer, is formed.

Figure 3C:
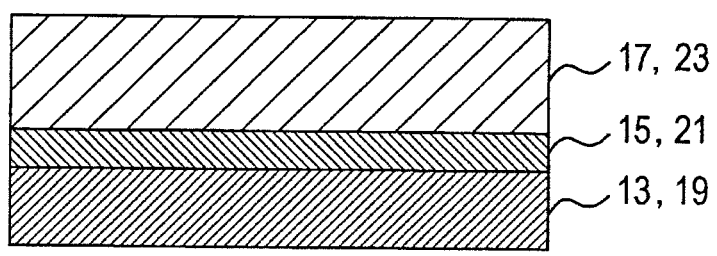

As shown in FIG. 3C, in the same CVD device, as a successive step (in-situ processing), a raw material provided by adding $N_2$ (nitrogen gas) to the mixed gas of $CH_4$ and $H_2$ as a dopant is supplied, and the emitter layer 17 made of the N-type diamond layer is formed on the carbide layer 15 by the microwave plasma CVD method. (Second step)

For example, the CVD device is held so that the temperature of the emitter base plate 13 on which the carbide layer 15 has been formed is in a range from 600 degrees Celsius to 1200 degrees Celsius, such as 800 degrees Celsius and the inside pressure is approximately 50 Torr, and the material for forming the emitter layer 17 is supplied to this CVD device.

As the source gas for forming the emitter layer 17, for example, a mixed gas in which $CH_4$ is diluted with $H_2$ is used. For example, a mixed gas in which the flow ratio of $CH_4$ to $H_2$ ($CH_4/H_2$) is 0.01 is used.

This mixed gas further contains $N_2$ as a dopant. The doping amount of the $N_2$ to the diamond layer is adjusted by controlling the flow ratio of the $N_2$ gas supplied to the CVD device. In the example 1, for example, the gas flow ratio of $N_2/CH_4$ is 2.

In this way, the emitter layer 17 made of the N-type diamond layer is formed on the carbide layer 15.

Figure 3D:
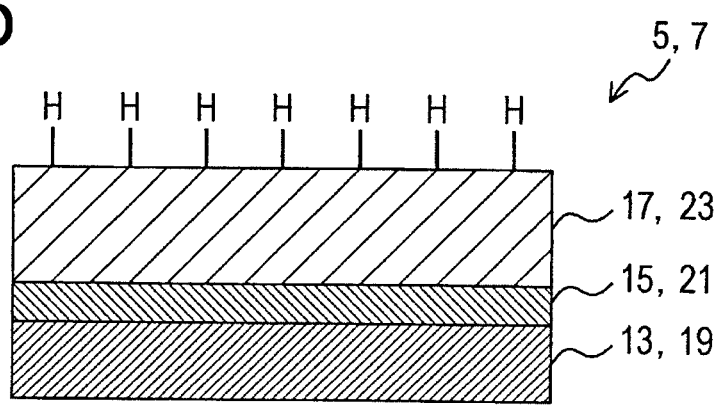

As shown in FIG. 3D, in the same CVD device, as a successive step (in-situ processing), the surface of the N-type diamond layer is hydrogen-terminated by plasma under a hydrogen atmosphere by the microwave plasma CVD method. (Third step)

That is, in a state where $H_2$ gas is supplied, the temperature of the base plate is lowered to 100 degrees Celsius or less, such as 30 degrees Celsius, while holding the inside pressure of the CVD device at approximately 50 Torr. Thus, the surface of the emitter layer 17 is hydrogen terminated.

In this way, the emitter electrode 5 having the emitter layer 17 the surface of which is hydrogen-terminated is formed.

In the example 1, the microwave plasma CVD method is employed to manufacture the emitter electrode 5. Alternatively, any other method may be employed. For example, any CVD method, such as RF plasma CVD, or DC plasma CVD and spattering, such as RF plasma spattering or DC plasma spattering may be employed.

<Manufacturing Method of Collector Electrode 7>

A manufacturing method of the collector electrode 7 is typically similar to the manufacturing method of the emitter electrode 5 described hereinabove. Therefore, the manufacturing method of the collector electrode 7 will be briefly described with reference to FIGS. 3A to 3D.

As shown in FIG. 3A, the collector base plate 19 made of a metal having a high reactivity with carbon, such as Ti, is prepared.

As shown in FIG. 3B, the carbide layer 21 is formed on the collector base plate 19 by supplying the mixed gas (source gas) of $CH_4$ and $H_2$ as a raw material, for example, in the microwave plasma CVD method. (First step) The carbide layer 21 is formed under the similar condition to that of forming the carbide layer 15 of the emitter electrode 5 as described above.

As shown in FIG. 3C, in the same CVD device, as a successive step, a raw material in which nitrogen gas ($N_2$) is added to the mixed gas of $CH_4$ and $H_2$ as a dopant is supplied, and thus the collector layer 23 made of the N-type diamond layer is formed on the carbide layer 21 by the microwave plasma CVD method. (Second step) The collector layer 23 is formed under the similar condition to that of forming the collector layer 17 of the emitter electrode 5.

As shown in FIG. 3D, in the same CVD device, as a successive step, the surface of the N-type diamond layer is hydrogen-terminated in the plasma under a hydrogen atmosphere by the microwave plasma CVD method. The hydrogen-termination is performed under the similar condition as that of the emitter electrode 5.

As a method of manufacturing the collector electrode 7, a method similar to a conventional method may be employed.

For example, the collector layer 23 made of the N-type diamond layer (diamond semiconductor film) may be formed on the collector base plate 19 made of Mo, without forming a carbide layer on the collector base plate 19, by a conventional CVD technique or a conventional spattering technique.

The diamond of the diamond semiconductor film may be single crystal diamond or polycrystalline diamond. For example, in a case where a diamond substrate generated by high-pressure synthesis is used, when a diamond semiconductor film is formed on the diamond base plate, the diamond has a single crystal structure.

c) Advantageous Effects of the Example 1 Will be Described.

In the example 1, to manufacture the emitter electrode 5 and the collector electrode 7, the carbide layers 15, 21 are formed on the emitter base plate 13 and the collector base palate 19, which are exemplarily made of Ti, by the microwave plasma CVD method. In this case, the carbide layers 15, 21 are made of Ti carbide. Next, the emitter layer 17 and the collector layer 23 each made of the N-type diamond layer to which the nitrogen is doped as the donor impurity are formed on the corresponding carbide layers 15, 21 by the microwave plasma CVD method. Further, the surface of the emitter layer 17 and the collector layer 23 is terminated with hydrogen.

In this way, after the carbide layers 15, 21 for the ohmic contact are formed on the emitter base plate 13 and the collector base plate 19, the N-type diamond layers for the emitter layer 17 and the collector layer 23 are formed on the surface of the carbide layers 15, 21. Further, the surface of the N-type diamond layer is terminated with hydrogen. Therefore, the separation of hydrogen is reduced.

The metal used for the emitter base plate 13 and the collector base plate 19 is Ti, which has a high reactivity with carbon. Therefore, carburizing of the surface of the metal is progressed, and the carbide layer 15, 21 as the interface between the metal and the N-type diamond layer is formed.

In addition, the carbide layers 15, 21 form a high-density defective level and contribute to electronic hopping conduction. Therefore, an ohmic contact with a low resistance can be realized.

In the emitter electrode 5, the separation of hydrogen is reduced. Therefore, the work function reduces, and the negative electron affinity increases. As a result, the emission efficiency of the thermions from the surface improves.

Also in the collector electrode 7, the separation of hydrogen from the hydrogen-terminated surface is reduced. Therefore, the work function reduces, resulting in an increase in power output.

Accordingly, when the emitter electrode 5 and the collector electrode 7 are manufactured by the above-described method, the power generation efficiency of the thermionic converter 1 improves.

That is, in the thermionic converter 1 manufactured by the above-described method, the emitter layer 17 and the collector layer 23, which are made of the N-type diamond layer, are formed on the carbide layers 15, 21 of the emitter base plate 13 and the collector base plate 19. Further, the surface of each of the emitter layer 17 and the collector layer 23 is hydrogen-terminated. Therefore, in the emitter electrode 5, since the work function is low, the negative electron affinity is high. With this, the efficiency of emitting the thermions from the surface of the emitter electrode 5 improves. Also in the collector electrode 7, the work function is low. Therefore, the high power generation performance is achieved.

In the thermionic converter 1 of the example 1, since the carbide layer 15, 21 does not contain adsorbate such as oxygen, an increase of an interface resistance between the emitter base plate 13 and the emitter layer 17, or between the collector base plate 19 and the collector layer 23 can be reduced.

Further, the manufacturing process of the example 1 is simple, as compared with a conventional high-temperature annealing.

EXAMPLE 2

Next, an example 2 will be described. Hereinafter, explanations of contents similar to the example 1 will be simplified. Also, like parts are designated with like reference numbers to the example 1.

In the example 2, a material of the emitter base plate 13 and the collector base plate 19 is molybdenum (Mo), in place of titanium (Ti).

A manufacturing method of an emitter electrode 5 will be described.

An emitter base plate 13 made of a metal having a high reactivity with carbon is prepared. In this case, the emitter base plate 13 is made of Mo, for example.

Next, a carbide layer 15 is formed on the emitter base plate 13 by supplying a mixed gas of $CH_4$ and $H_2$ as a raw material (source gas), by the microwave plasma CVD method. (First step) In this case, the carbide layer 15 is made of molybdenum carbide. The carbide layer 15 may be formed under the condition similar to the example 1. However, the temperature of the base plate may be modified depending on the material of the base plate. For example, the temperature of the base plate may be 1000 degrees Celsius.

Next, in the same CVD device, as a successive step, an emitter layer 17 made of an N-type diamond layer is formed on the carbide layer 15 by supplying a raw material in which nitrogen gas ($N_2$) is added to the mixed gas of $CH_4$ and $H_2$ as a dopant, by the microwave plasma CVD method. (Second step) The emitter layer 17 may be formed under the condition similar to the example 1.

Next, in the same CVD device, as a successive step, the surface of the N-type diamond layer is terminated with hydrogen in the plasma under a hydrogen atmosphere by the microwave plasma CVD method. (Third step) The hydrogen-termination is performed under the condition similar to the example 1.

A collector electrode 7 of the example 2 may be manufactured in the similar method to the collector electrode 7 of the example 1 as described above.

Also in the example 2, the advantageous effects similar to the example 1 will be achieved.

EXAMPLE 3

Next, an example 3 will be described. Hereinafter, explanation of contents similar to the example 1 will be simplified. Also, like parts will be designated with like reference numbers to the example 1, In the example 3, phosphorous (P) is used as the dopant, in place of nitrogen (N).

Hereinafter, a manufacturing method of an emitter electrode 5 will be described.

An emitter base plate 13 made of a metal having a reactivity with carbon is prepared. In this case, the emitter base plate 13 made of Ti is used, for example.

A carbide layer 15 is formed on the emitter base plate 13 by supplying a mixed gas of $CH_4$ and $H_2$ as a raw material (source gas), by the microwave plasma CVD method. (First step) The carbide layer 15 may be formed under the condition similar to the example 1.

Next, in the same CVD device, as a successive step, an emitter layer 17 made of an N-type diamond layer is formed on the carbide layer 17 by supplying a raw material in which $PH_3$ is added to the mixed gas of $CH_4$ and $H_2$ as the dopant, by the microwave plasma CVD method. (Second step) The condition of forming the carbide layer 7 is substantially similar to that of the example 1. However, when the $PH_3$ is doped, a gas flow ratio of $PH_3/CH_4$ is, for example, set to 0.01.

Next, in the same CVD device, as a successive step, the surface of the N-type diamond layer is terminated with hydrogen in plasma under the hydrogen atmosphere, by the microwave plasma CVD method. (Third step) The hydrogen termination of the example 3 may be performed under the condition similar to that of the example 1.

A collector electrode 7 of the example 3 will be manufactured by the similar method to the collector electrode 7 of the example 1.

Also in the example 3, the advantageous effects similar to the example 1 will be achieved.

EXAMPLE 4

An example 4 will be described. Hereinafter, explanation of the contents similar to the example 1 will be simplified. Like parts will be designated with like reference numbers to the example 1.

In the example 4, the emitter base plate and the collector base plate made of an iridium rhodium alloy are used.

Hereinafter, a manufacturing method of an emitter electrode 5 will be described.

An emitter base plate 13 made of an alloy having a high reactivity with carbon is prepared. In the example 4, for example, the emitter base plate 13 made of the iridium rhodium alloy is prepared. In the alloy, a ratio (mass ratio) of iridium to rhodium is 0.9 to 0.1 (i.e., iridium:rhodium=0.9:0.1).

A carbide layer 15 is formed on the surface of the emitter base plate 13 by supplying a mixed gas of $CH_4$ and $H_2$ as a raw material (source gas), by the microwave plasma CVD method. In this case, the carbide layer 15 is made of a carbide of iridium rhodium. (First step) The condition of forming the carbide layer 15 is substantially similar to that of the example 1. However, the temperature of the base plate may be modified depending on the material of the base plate. For example, the temperature of the base plate may be 900 degrees Celsius.

In the same CVD device, as a successive step, an emitter layer 17 made of an N-type diamond layer is formed on the carbide layer 15 by supplying a raw material in which nitrogen gas ($N_2$) is added as a dopant to a mixed gas of $CH_4$ and $H_2$, by the microwave plasma CVD method. (Second step) The emitter layer 17 may be formed under the condition similar to that of the example 1.

In the same CVD device, as a successive step, the surface of the N-type diamond layer is terminated with hydrogen in plasma under a hydrogen atmosphere, by the microwave plasma CVD method. The hydrogen termination may be performed under the condition similar to that of the example 1.

A collector electrode 7 will be manufactured in the similar manner to the collector electrode 7 of the example 1.

Also in the example 4, the advantageous effects similar to the example 1 will be achieved.

While only the selected exemplary embodiment and examples have been chosen to illustrate the present disclosure, it will, be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents. For example, a configuration of an example (e.g., material and composition) may be employed to another example.

What is claimed is:

1. A method of manufacturing an electrode of a thermionic converter, the electrode being at least one of an emitter electrode and a collector electrode of the thermionic converter, the method comprising:
   forming a carbide layer on a base material by a vapor synthesis, the base material being made of a metal and the carbide layer being made of a metal carbide;
   forming an N-type diamond layer doped with a donor impurity on the carbide layer by a vapor synthesis; and
   terminating a surface of the N-type diamond layer with hydrogen,
   wherein
   in the forming of the carbide layer, the base material is heated to a temperature equal to or higher than 800 degrees Celsius and equal to or lower than 1200 degrees Celsius,
   in the terminating of the surface of the N-type diamond layer, the temperature of the base material on which the N-type diamond layer has been formed is lowered to 100 degrees Celsius or less, and the surface of the N-type diamond layer is terminated with hydrogen.

2. The method according to claim 1, wherein
the metal of the base material is one selected from a group consisting of titanium, zirconium, hafnium, molybdenum, iridium, tantalum, tungsten, chromium, and platinum.

3. The method according to claim 1, wherein
the metal of the base material is an alloy made of at least two selected from a group consisting of titanium, zirconium, hafnium, molybdenum, iridium, tantalum, tungsten, chromium, and platinum.

4. The method according to claim 1, wherein
in the forming of the carbide layer, a mixed gas of methane and hydrogen is supplied as a raw material, and the carbide layer is formed on the base material by a microwave plasma chemical vapor deposition,
in the forming of the N-type diamond layer, a mixed gas of methane, hydrogen and a donor impurity is supplied as a raw material, and the N-type diamond layer is formed on the carbide layer by a microwave plasma chemical vapor deposition, and
in the terminating of the surface of the N-type diamond layer, hydrogen is supplied and the surface of the N-type diamond layer is terminated with the hydrogen in an atmosphere of plasma of hydrogen by a microwave plasma chemical vapor deposition.

5. The method according to claim 4, wherein
a flow ratio of the methane to the hydrogen of the mixed gas in the forming of the carbide layer is equal to or greater than 0.01 and equal to or lower than 0.05.

6. The method according to claim 1, wherein
the donor impurity is nitrogen or phosphorous.

7. The method according to claim 1, wherein
in the forming of the N-type diamond layer, the temperature of the base material is held to the temperature equal to or higher than 800 degrees Celsius and equal to or lower than 1200 degrees Celsius.

* * * * *